US008665642B2

(12) United States Patent
Rychlik et al.

(10) Patent No.: US 8,665,642 B2
(45) Date of Patent: Mar. 4, 2014

(54) PATTERN-SENSITIVE CODING OF DATA FOR STORAGE IN MULTI-LEVEL MEMORY CELLS

(75) Inventors: Bohuslav Rychlik, San Diego, CA (US); John Eric Linstadt, Palo Alto, CA (US); Brent Steven Haukness, Monte Sereno, CA (US); Steven C. Woo, Saratoga, CA (US)

(73) Assignee: Rambus Inc., Sunnyvale, CA (US)

( * ) Notice: Subject to any disclaimer, the term of this patent is extended or adjusted under 35 U.S.C. 154(b) by 208 days.

(21) Appl. No.: 13/140,345

(22) PCT Filed: Oct. 8, 2009

(86) PCT No.: PCT/US2009/059994
§ 371 (c)(1),
(2), (4) Date: Jun. 16, 2011

(87) PCT Pub. No.: WO2010/077408
PCT Pub. Date: Jul. 8, 2010

(65) Prior Publication Data
US 2011/0286267 A1 Nov. 24, 2011

Related U.S. Application Data

(60) Provisional application No. 61/142,054, filed on Dec. 31, 2008.

(51) Int. Cl.
*G11C 11/34* (2006.01)
*G11C 16/04* (2006.01)
(52) U.S. Cl.
USPC .............. 365/185.03; 365/185.09; 365/189.16

(58) Field of Classification Search
USPC .............. 365/185.03 O, 185.09 X, 189.16 X, 365/185.03, 185.09, 189.011, 189.16
See application file for complete search history.

(56) References Cited

U.S. PATENT DOCUMENTS 5,973,958 A 10/1999 Parker
6,297,988 B1 10/2001 Parker et al.
(Continued)

OTHER PUBLICATIONS

Joo, et al., *An Energy Characterization Platform for Memory Devices and Energy-Aware Data Compression for Multilevel-Cell Flash Memory*, ACM Transaction on Design Automation of Electronic Systems, vol. 13, No. 3, Article 43, Jul. 2008, 29 pgs.

(Continued)

*Primary Examiner* — Vanthu Nguyen
(74) *Attorney, Agent, or Firm* — Morgan, Lewis & Bockius LLP

(57) ABSTRACT

A method of operating a memory device includes receiving first and second sets of bits to be stored in multi-level cells in the device. A multi-level encoding is selected from among a plurality of multi-level encodings for storing the first and second sets of bits in the multi-level cells. Each multi-level encoding includes at least four encoding levels for a respective multi-level cell. Respective multi-level encodings have respective costs associated with programming the first and second sets of bits into the multi-level cells in accordance with the respective multi-level encodings. The multi-level encoding is selected based on the respective costs of the respective encodings. The first and second sets of bits are encoded in accordance with the selected multi-level encoding to produce encoded data for storage in the device such that a respective multi-level cell stores respective bits from both the first and second sets of bits.

34 Claims, 9 Drawing Sheets

(56) References Cited

U.S. PATENT DOCUMENTS

| | | | |
|---|---|---|---|
| 7,697,325 B2 * | 4/2010 | Sprouse et al. | 365/185.03 |
| 8,176,234 B2 * | 5/2012 | Franceschini et al. | 711/103 |
| 2007/0171714 A1 | 7/2007 | Wu et al. | 365/185.09 |
| 2008/0104357 A1 | 5/2008 | Kim et al. | 711/170 |
| 2008/0151621 A1 | 6/2008 | Kong et al. | 365/185.03 |

OTHER PUBLICATIONS

International Search Report and Written Opinion for PCT/US2009/059994 dated Apr. 27, 2010, 6 pgs.

* cited by examiner

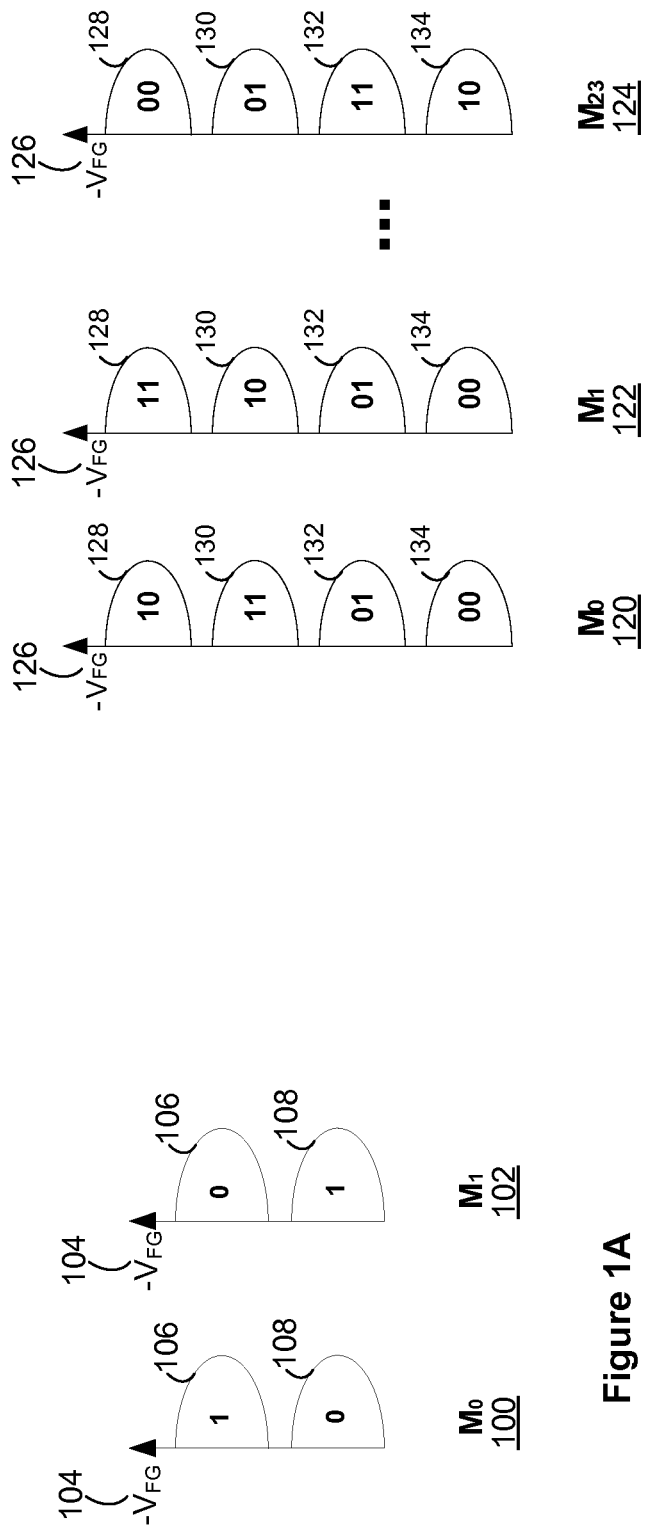

PATTERN-SENSITIVE CODING OF DATA FOR STORAGE IN MULTI-LEVEL MEMORY CELLS

CROSS REFERENCE TO RELATED APPLICATIONS

This application is a United States National Stage Application filed under 35 U.S.C. §371 of PCT Patent Application Serial No. PCT/US2009/059994 filed Oct. 8, 2009 which claims the benefit of and priority to U.S. Provisional Application No. 61/142,054 filed on Dec. 31, 2008, the disclosures of all of which are hereby incorporated by reference in their entirety.

TECHNICAL FIELD

The disclosed embodiments relate generally to computer memory, and more particularly, to programming data into multi-level memory cells.

BACKGROUND

Memory cells that store more than one bit per cell are referred to as multi-level cells. One example of multi-level cell technology is nonvolatile multi-level cell technology. Programming data into multi-level nonvolatile memory cells, and into nonvolatile memory in general, presents multiple engineering challenges. For example, programming is slow: multiple program-and-verify cycles are required, the number and duration of which are functions of the data being programmed and the programming time of individual cells. Furthermore, cell damage that occurs during programming cycles limits the number of times that a cell may be erased and re-programmed. Programming data into a particular cell also can disturb adjacent cells. Accordingly, there is a need to reduce the number and duration of programming cycles, as well as the damage that programming causes, by intelligently programming multi-level cells.

BRIEF DESCRIPTION OF THE DRAWINGS

FIGS. 1A-1D are logical diagrams illustrating encodings for storing data in memory cells in accordance with some embodiments.

Like reference numerals refer to corresponding parts throughout the drawings.

DESCRIPTION OF EMBODIMENTS

Figure 1C:
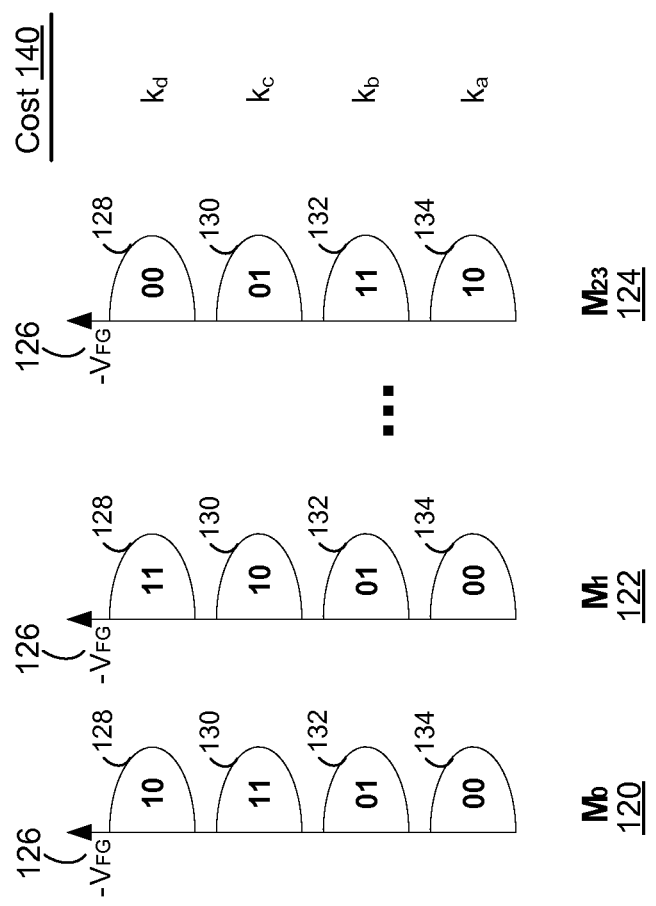

In some embodiments, a method of operating a memory device includes receiving a first set of bits and a second set of bits to be stored in a plurality of multi-level cells in the memory device. A multi-level encoding is selected from among a plurality of multi-level encodings for storing the first and second sets of bits in the plurality of multi-level cells. Each multi-level encoding of the plurality of multi-level encodings includes at least four encoding levels for a respective multi-level cell. Respective multi-level encodings of the plurality of multi-level encodings have respective costs associated with programming the first and second sets of bits into the plurality of multi-level cells in accordance with the respective multi-level encodings. The multi-level encoding is selected based on the respective costs of the respective encodings. The first and second sets of bits are encoded in accordance with the selected multi-level encoding to produce encoded data for storage in the memory device such that a respective multi-level cell of the plurality of multi-levels cells stores both a respective bit from the first set of bits and a respective bit from the second set of bits.

In some embodiments, a method of operating a memory device includes identifying a first encoding with which a first set of bits has been programmed into a plurality of multi-level cells. A second set of bits to be stored in the plurality of multi-level cells in the memory device is received. A multi-level encoding is selected from among a plurality of multi-level encodings for storing the first and second sets of bits in the plurality of multi-level cells. Each multi-level encoding of the plurality of multi-level encodings includes at least four encoding levels for a respective multi-level cell. Respective multi-level encodings of the plurality of multi-level encodings have respective costs associated with programming the first and second sets of bits into the plurality of multi-level cells in accordance with the respective multi-level encodings. The multi-level encoding is selected based on the respective costs of the respective encodings. The first and second sets of bits are encoded in accordance with the selected multi-level encoding to produce encoded data for storage in the memory device such that a respective multi-level cell of the plurality of multi-levels cells stores both a respective bit from the first set of bits and a respective bit from the second set of bits.

In some embodiments, circuitry to control memory includes a buffer to queue data to be stored in a plurality of multi-level cells in a memory device. The data includes a first set of bits and a second set of bits. The circuitry to control memory also includes cost-evaluation circuitry to evaluate costs associated with programming the first and second sets of bits into the plurality of multi-level cells in accordance with respective multi-level encodings of a plurality of multi-level encodings and to select, based on the evaluated costs, a respective multi-level encoding of the plurality of multi-level encodings with which to program the first and second sets of bits into the plurality of multi-level cells. Each multi-level encoding of the plurality of multi-level encodings includes at least four encoding levels for a respective multi-level cell. The circuitry to control memory further includes an encoder to encode the first and second sets of bits, in accordance with the selected multi-level encoding, for storage in the plurality of multi-level cells such that a respective multi-level cell of the plurality multi-levels cells stores both a respective bit from the first set of bits and a respective bit from the second set of bits.

In some embodiments, circuitry to control memory includes means for receiving a first set of bits and a second set of bits to be stored in a plurality of multi-level cells in the memory device. The circuitry to control memory also includes means for selecting a multi-level encoding from among a plurality of multi-level encodings for storing the first and second sets of bits in the plurality of multi-level cells. Each multi-level encoding of the plurality of multi-level encodings includes at least four encoding levels for a respective multi-level cell. Respective multi-level encodings of the plurality of multi-level encodings have respective costs associated with programming the first and second sets of bits into the plurality of multi-level cells in accordance with the respective multi-level encodings. The means for selecting include means for selecting the multi-level encoding based on the respective costs of the respective encodings. The circuitry to control memory further includes means for encoding the first and second sets of bits in accordance with the selected multi-level encoding to produce encoded data for storage in the memory device such that a respective multi-level cell of the plurality of multi-levels cells stores both a respective bit from the first set of bits and a respective bit from the second set of bits.

In some embodiments, a computer-readable medium contains circuit description data that, when operated on by a circuit compiler program being executed by a processor, synthesizes memory controller circuitry. The circuit description data includes a description of a buffer to queue data to be stored in a plurality of multi-level cells in a memory device. The data includes a first set of bits and a second set of bits. The circuit description data also includes a description of cost-evaluation circuitry to evaluate costs associated with programming the first and second sets of bits into the plurality of multi-level cells in accordance with respective multi-level encodings of a plurality of multi-level encodings and to select, based on the evaluated costs, a respective multi-level encoding of the plurality of multi-level encodings with which to program the first and second sets of bits into the plurality of multi-level cells. Each multi-level encoding of the plurality of multi-level encodings includes at least four encoding levels for a respective multi-level cell. The circuit description data further includes a description of an encoder to encode the first and second sets of bits, in accordance with the selected multi-level encoding, for storage in the plurality of multi-level cells such that a respective multi-level cell of the plurality multi-levels cells stores both a respective bit from the first set of bits and a respective bit from the second set of bits.

Reference will now be made in detail to embodiments, examples of which are illustrated in the accompanying drawings. In the following detailed description, numerous specific details are set forth in order to provide a thorough understanding of the present invention. However, it will be apparent to one of ordinary skill in the art that the present invention may be practiced without these specific details. In other instances, well-known methods, procedures, components, and circuits have not been described in detail so as not to unnecessarily obscure aspects of the embodiments.

A single-level cell in a memory device such as a nonvolatile memory device only stores a single bit per cell. In some nonvolatile memory devices, such as flash memory (including, for example, floating-gate flash technologies and charge-trapping flash technologies (e.g., silicon-oxide-nitride-oxide-silicon (SONOS) memory and TaN—$Al_2O_3$—SiN-oxide-Si (TANOS) memory)), a first range of voltage levels corresponds to a first bit value (e.g., a zero) and a second range of voltage levels corresponds to a second bit value (e.g., a one). In other nonvolatile memory devices, such as phase change (e.g., chalcogenide) and resistance random access memories (RRAMs), a first range of resistance levels corresponds to a first bit value (e.g., a zero) and a second range of resistance levels corresponds to a second bit value (e.g., a one). (Respective ranges of voltage or resistance levels corresponding to respective bit values are hereinafter simply referred to as levels for convenience). In optical memory devices, a first range of opacity or reflectivity corresponds to a first bit value (e.g., a zero) and a second range of opacity or reflectivity corresponds to a second bit value (e.g., a one). The term "single-level cell" thus is a misnomer, since single-level cells have two levels for storing two respective bit values.

Single-level cells have two possible encodings or mappings $M_0$ 100 and $M_1$ 102, as illustrated for floating-gate (e.g., flash) memory cells in FIG. 1A in accordance with some embodiments. In the $M_0$ 100 encoding, a floating gate voltage $V_{FG}$ 104 has a first level 106 that corresponds to a stored bit value of "one" and a second level 108 that corresponds to a stored bit value of "zero." In the $M_1$ 102 encoding, the first level 106 corresponds to a stored bit value of "zero" and the second level 108 corresponds to a stored bit value of "one." In other words, if $V_{FG}$ 104 for a cell is at the first level 106, the cell stores a "one" in the $M_0$ 100 encoding and a "zero" in the $M_1$ 102 encoding. If $V_{FG}$ 104 for a cell is at the second level 108, the cell stores a "zero" in the $M_0$ 100 encoding and a "one" in the $M_1$ 102 encoding.

While a single-level cell only stores one bit per cell, a multi-level cell in a memory device (e.g., a nonvolatile memory device) can store more than one bit per cell. For example, a 2-bit multi-level cell has four distinct levels for storing a 2-bit data word, and a 3-bit multi-level cell has eight distinct levels for storing a 3-bit data word. The number of total possible multi-level encodings for a multi-level cell equals the factorial of the number of distinct levels (e.g., distinct voltage levels, resistance levels, or levels of reflectivity or opacity): a 2-bit multi-level cell has 4! (=24) possible encodings for storing two bits, while a 3-bit multi-level cell has 8! possible encodings for storing three bits. FIG. 1B illustrates some possible multi-level encodings $M_0$ 120, $M_1$ 122, and $M_{23}$ 124 for 2-bit floating-gate (e.g., flash) multi-level cells in accordance with some embodiments. In the $M_0$ 120 encoding, a floating gate voltage $V_{FG}$ 126 has a first level 128 that corresponds to a binary value of "10" for a two-bit data word stored in the cell, a second level 130 that corresponds to a binary value of "11," a third level 132 that corresponds to a binary value of "01," and a fourth level 134 that corresponds to a binary value of "00." In other words, a cell stores "10" if $V_{FG}$ 126 is at the first level 128, "11" if $V_{FG}$ 126 is at the second level 130, "01" if $V_{FG}$ 126 is at the third level 132, and "00" if $V_{FG}$ 126 is at the fourth level 134. In the $M_1$ 122 encoding, a cell stores "11" if $V_{FG}$ 126 is at the first level 128, "10" if $V_{FG}$ 126 is at the second level 130, "01" if $V_{FG}$ 126 is at the third level 132, and "00" if $V_{FG}$ 126 is at the fourth level 134. In the $M_{23}$ 124 encoding, a cell stores "00" if $V_{FG}$ 126 is at the first level 128, "01" if $V_{FG}$ 126 is at the second level 130, "11" if $V_{FG}$ 126 is at the third level 132, and "10" if $V_{FG}$ 126 is at the fourth level 134.

While the multi-level encodings in FIG. 1B are shown and described in the context of floating-gate memory cells, similar encodings may be used for any multi-level cell with distinct levels (e.g., distinct voltage or resistance levels) that correspond to distinct values of multi-bit data words.

In some embodiments, each bit of a multi-bit data word stored in a multi-level cell is associated with a distinct set of bits. For example, in a two-bit multi-level cell, the least significant bit (LSB) may be from a first page ("the lower page") and the most significant bit (MSB) may be from a second page ("the upper page"). In a three-bit or higher multi-level cell, each of the three bits may be from a distinct page. A specified plurality of multi-level cells thus may simultaneously store multiple pages, such that each multi-level cell in the plurality stores a respective bit from each of the multiple pages. Alternatively, each bit in a multi-level cell may be associated with a distinct sub-page, such that each multi-level cell in a specified plurality stores a respective bit from each of the multiple sub-pages.

Depending on the data to be programmed into a group of multi-level cells, different encodings may have different associated costs. The cost associated with using a particular encoding to program specified data sets (e.g., particular pages) may reflect various factors associated with (or aspects of) the programming, such as the time required for the programming, cell damage caused by the programming, disturbed data in other cells ("program disturb"), and other reliability or performance issues. Cost functions that reflect these factors may be defined for respective encodings. The cost of using various respective encodings to program specified data sets then may be calculated using respective cost functions and an encoding may be chosen that has a low or minimal cost of programming the specified data sets. Different encodings thus may be used to program different sets of data (e.g., different pairs of upper and lower pages) into a multi-level memory.

For the example of two-bit multi-level cells (i.e., multi-level cells that store two-bit data words), a cost function $f_n$ corresponding to each encoding $M_n$ (e.g., $M_0$ 120, $M_1$ 122, and $M_{23}$ 124, FIG. 1B) may be defined, where n is an integer used to refer to respective encodings:

$$f_n([00,01,11,10])=[k_{00},k_{01},k_{11},k_{10}] \quad (1)$$

where $[k_{00}, k_{01}, k_{11}, k_{10}]$ are the respective costs associated with writing respective data words [00,01,11,10] to a multi-level cell using a respective encoding $M_n$. In some embodiments, the respective costs are determined based on the levels to which respective two-bit data words are written in accordance with the respective encoding $M_n$. Specifically, a cost may be assigned to programming a cell to each of its levels. For example, programming a cell to the fourth level 134 (FIG. 1C) has a cost $k_a$, programming a cell to the third level 132 has a cost $k_b$, programming a cell to the second level 130 has a cost $k_c$, and programming a cell to the first level 128 has a cost $k_d$. FIG. 1C illustrates this assignment of a cost 140 to each level 128 through 134.

In some embodiments, the lowest cost is set to zero. For example, in a floating-gate memory cell, the level with the lowest value of $-V_{FG}$ 126 (e.g., level 134, FIG. 1C) will typically have the lowest cost, because no voltage pulse need be applied to program the cell once the cell has been erased. Thus, in the example of FIG. 1C, $k_a$ may be set to zero.

Knowing the costs associated with programming a cell to each level, and knowing how the various encodings maps data words to levels, cost functions for the various encodings may be calculated. Thus, cost functions $f_0$, $f_1$, and $f_{23}$ corresponding to respective encodings $M_0$ 120, $M_1$ 122, and $M_{23}$ 124 are defined as:

$$f_0([00,01,11,10])=[k_a,k_b,k_c,k_d] \quad (2)$$

$$f_1([00,01,11,10])=[k_a,k_b,k_d,k_c] \quad (3)$$

$$f_{23}([00,01,11,10])=[k_d,k_c,k_b,k_a] \quad (4)$$

Particular values of $[k_a,k_b,k_c,k_d]$ may be calculated by characterizing the multi-level cells used in a particular type of memory device, and thus will vary depending on cell design and technology. Some hypothetical (i.e., prophetic) values of $[k_a,k_b,k_c,k_d]$ include [0,1,2,3], [0,1.0,1.1,1.2], and [0,1,1,1]. In the example of $[k_a,k_b,k_c,k_d]=[0,1,2,3]$, $f_0$, $f_1$, and $f_{23}$ would be defined as:

$$f_0([00,01,11,10])=[0,1,2,3] \quad (5)$$

$$f_1([00,01,11,10])=[0,1,3,2] \quad (6)$$

$$f_{23}([00,01,11,10])=[3,2,1,0] \quad (7)$$

While the cost functions of equations (1)-(7) apply to two-bit multi-level cells, similar cost functions may be derived for multi-level cells that store three-bit data words (i.e., a three-bit multi-level cell, which simultaneously stores three bits) or more. Specifically, a cost may be assigned to programming a cell to each available level (e.g., to each of eight available levels for a three-bit multi-level cell) and cost functions calculated accordingly.

Given defined cost functions $f_n$ for respective encodings $M_n$, costs of programming particular sets of data (e.g., particular combinations of lower and upper pages, or lower and upper sub-pages) into multi-level cells using the respective encodings may be calculated. For example, if L and U represent lower and upper page bit vectors, and $l_k$ and $u_k$ represent the kth bits of L and U respectively, then a cost of programming L and U into a plurality of N multi-level cells (where N is an integer specifying the number of multi-level cells in the plurality) using a respective encoding $M_n$, such that each multi-level cell in the plurality simultaneously stores bits $l_k$ and $u_k$, is defined as:

$$\text{Cost}_n = \sum_{k=1}^{N} f_n(u_k, l_k) \quad (8)$$

For example, for purposes of illustration, if U=[0,0,1,0] and L=[0,1,1,0], then programming L and U into four multi-level cells corresponds to programming "00" ($=u_1l_1$) into the first cell, "01" ($=u_2l_2$) into the second cell, "11" ($=u_3l_3$) into the third cell, and "00" ($=u_4l_4$) into the fourth cell. Using the cost functions of Equations (5)-(7) in Equation (8), the $\text{Cost}_0$ of programming U and L in accordance with the encoding $M_0$ 120 (FIG. 1B) is 3 (=0+1+2+0), the $\text{Cost}_1$ of programming U and L in accordance with the encoding $M_1$ 122 is 4 (=0+1+3+0), and the $\text{Cost}_{23}$ of programming U and L in accordance with the encoding $M_{23}$ 124 is 9 (=3+2+1+3).

The various costs for programming particular sets of data using various respective encodings may be calculated sequentially or in parallel. Once the various costs have been calculated, a low or minimal cost is identified and its corresponding respective encoding is used to encode the data sets (e.g., to encode an upper page U and lower page L). The encoded data sets then are programmed into the multi-level cells. Data specifying the encoding used to encode the data sets is also stored, to allow the programmed data to be read back and decoded. The data specifying the encoding, sometimes referred to as an encode map, may be stored in the same memory array as the encoded data, or may be stored separately, for example in another memory array or in a buffer. In some embodiments, the encode map is stored in the same memory array as the encoded data but is stored using single-level encoding, such that each cell that stores data specifying the encoding only stores a single bit. To read back the stored encoded data (e.g., the upper and lower pages), the encode map is accessed and the encoding identified. The stored encoded data is then read from the memory array and decoded in accordance with the identified encoding, thereby recovering the original data.

In some embodiments, the available multi-level encodings are limited to a subset of all potential multi-level encodings for storing multiple-bit data words in multi-level cells. In the example of two-bit multi-level cells, the available multi-level encodings may be limited to a subset of the 24 (=4!) possible encodings. Costs are only determined for the available subset, thus simplifying selection of an encoding.

Figure 1D:
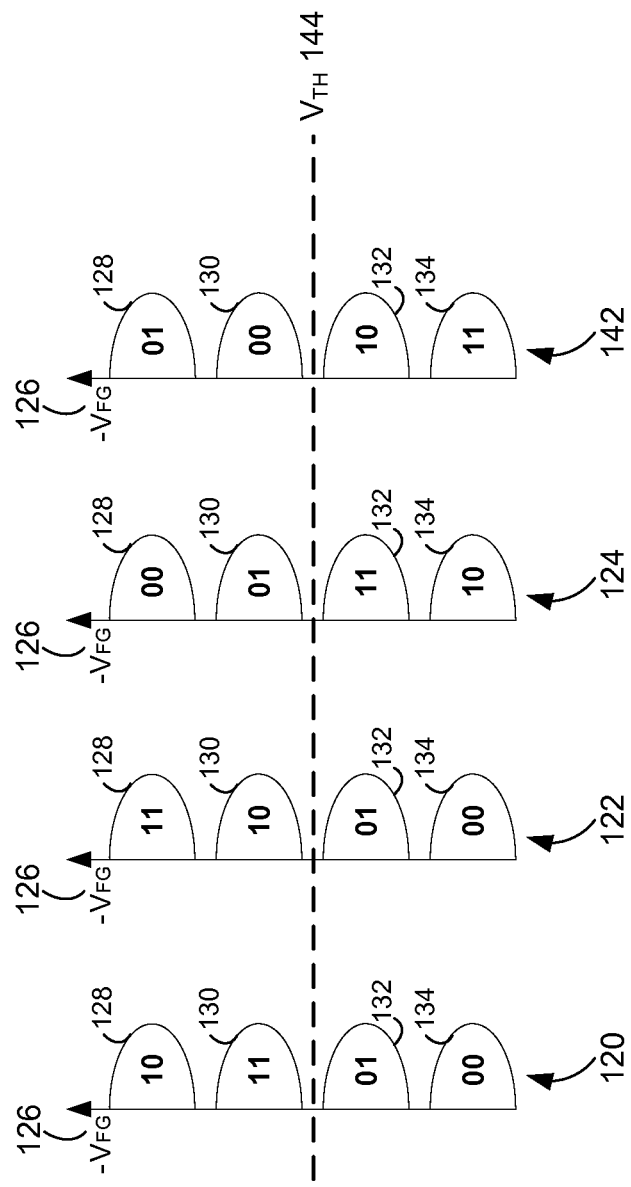

In some embodiments, the available multi-level encodings are limited to encodings for which all cell levels above a specified reference level (e.g., above a specified voltage reference or resistance reference) correspond to a first value of one of the bits stored in the cell and all levels below the specified reference level correspond to a second value of one of the bits stored in the cell. FIG. 1D illustrates examples of multi-level encodings for two-bit multi-level cells in which the MSB of the top two levels 128 and 130 corresponds to a first bit value (e.g., "1" for encodings 120 and 122 and "0" for encodings 124 and 142) and the MSB of the bottom two levels 132 and 134 corresponds to a second bit value (e.g., "0" for encodings 120 and 122 and "1" for encodings 124 and 142). FIG. 1D shows only some of the possible encodings that satisfy this criterion. A reference voltage $V_{REF}$ 144 is defined between the top levels (128 and 130) and the bottom levels (132 and 134). Limiting the available multi-level encodings in this manner simplifies and speeds up read operations for the MSB: to read the MSB, the cell voltage is compared against $V_{REF}$ 144. In some embodiments, the MSB and LSB are associated with respective upper and lower pages, in which case the upper page is referred to as the fast page because it may be read faster than the lower page. In some embodiments, the available multi-level encodings are limited to encodings for which the LSB of levels above a reference level have a first value and the LSB of levels below the reference level have a second value. If the MSB and LSB are associated with respective upper and lower pages, then the lower page is the fast page.

Figure 2:
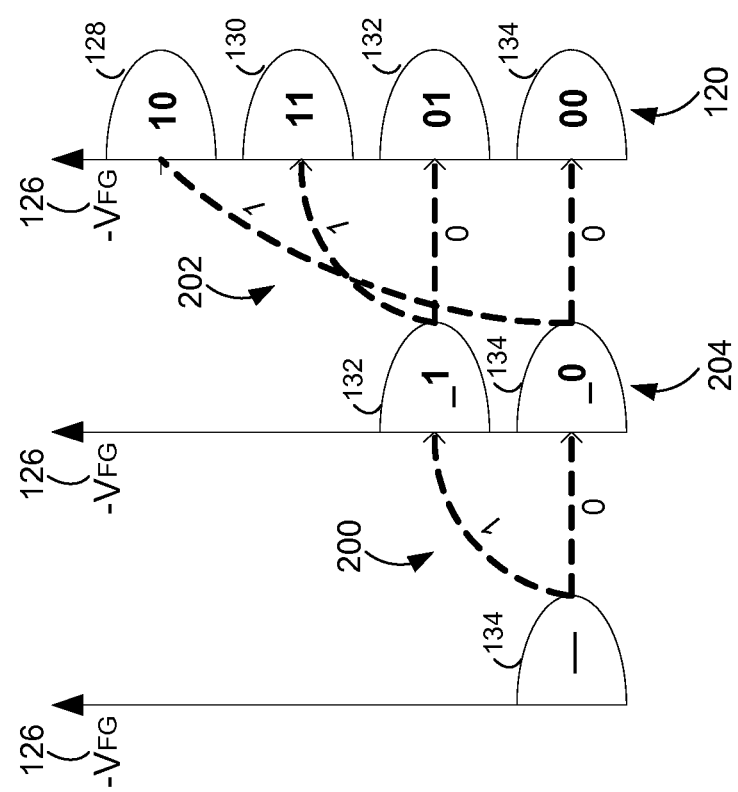
FIG. 2 is a logical diagram illustrating two-step programming of multi-level cells in accordance with some embodiments.

In some embodiments, programming two-bit multi-level cells is performed in two steps, as illustrated in FIG. 2 in accordance with some embodiments. In a first programming step 200, a single value (e.g., a bit in a lower page) is programmed into each multi-level cell. In the example of FIG. 2, a "1" is written by programming the cell to the level 132 and a "0" is written by programming the cell to the level 134 (the lowest level). Alternatively, a "0" may be written by programming the cell to the level 132 and a "1" written by programming the cell to the level 134. Programming the cell to the lowest level 134 effectively means in some embodiments that the cell is not programmed, because the cell is reset to the lowest level 134 when it is erased prior to programming. In some embodiments, an encoding 204 used in the first programming step 200 is determined based on the data to be programmed: if the data has more zeros than ones, then zeros are written by programming cells to the lowest level 134 and ones are written by programming cells to the level 132. If the data has more ones than zeros, then ones are written by programming cells to the lowest level 134 and zeros are written by programming cells to the level 132.

In a second programming step 202, the cells are programmed to store two bits in accordance with a selected multi-level encoding. The multi-level encoding is selected, for example, by using Equation (8) to calculate costs associated with various available multi-level encodings and identifying a low or lowest cost encoding. In the example of FIG. 2, the encoding $M_0$ 120 has been selected and the cells are programmed in accordance with the encoding $M_0$ 120.

The first programming step 200 and second programming step 202 are separated in time. For example, the data (e.g., a lower page) programmed in the step 200 may be received prior to the additional data (e.g., an upper page) to be programmed in the step 202. In some embodiments, the data programmed in the step 200 is read back and analyzed as part of the cost calculation process associated with the step 202.

As an alternative to the two-step programming illustrated in FIG. 2, in some embodiments data is programmed in a single step. For example, a lower page and an upper page are simultaneously programmed, without having previously programmed the lower page (or upper page). In another example, two bits from a single page are programmed into a respective cell in a single step.

Multi-step programming for multi-level cells that each store more than 2 bits may be performed by analogy to the two programming steps 200 and 202 in FIG. 2. For example, 3-bit multi-level cells may be programmed in three steps. The first step programs each cell to store a single bit, the second step programs each cell to store two bits, and the third step programs each cell to store three bits.

Figure 3:
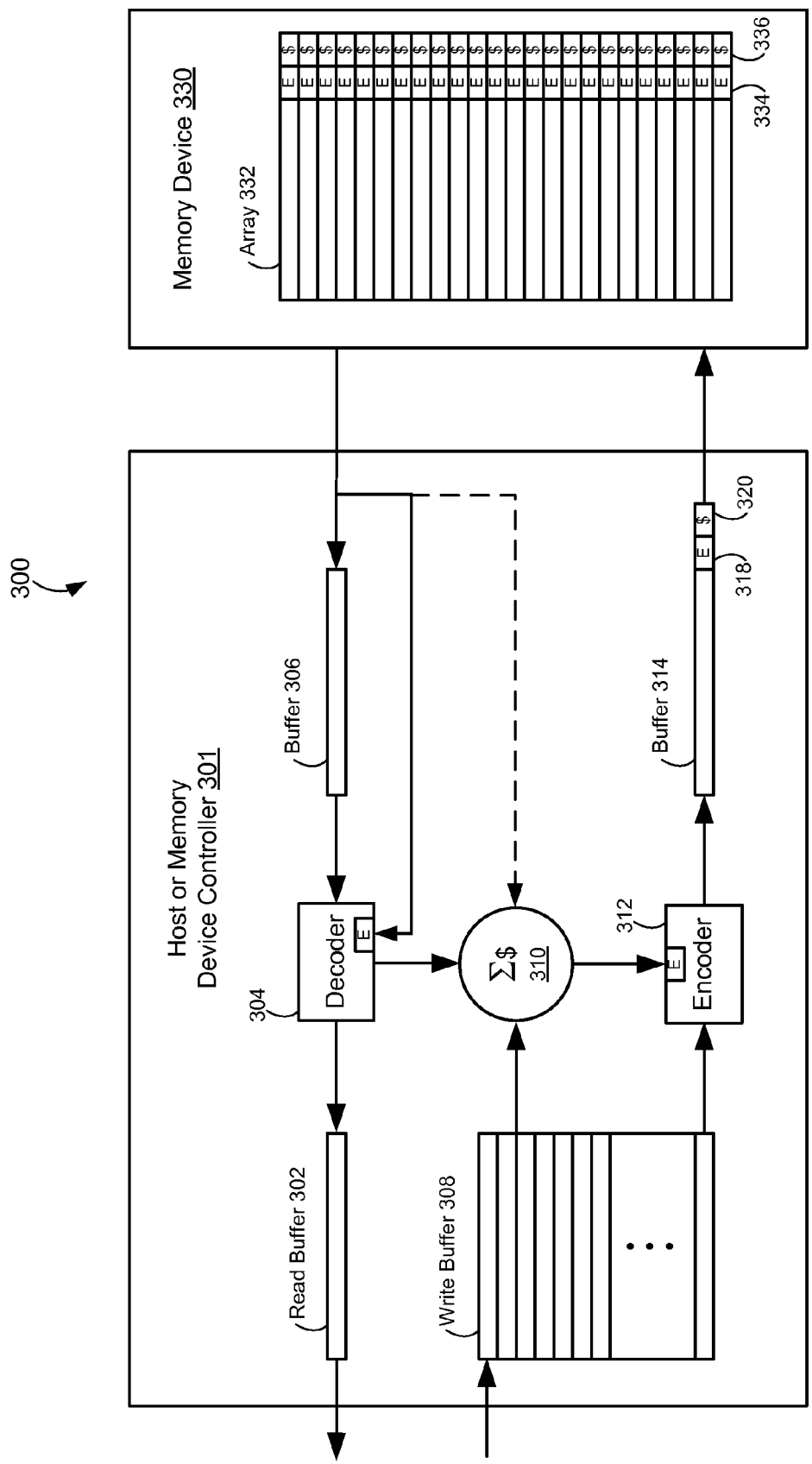
FIG. 3 is a block diagram of a system including a nonvolatile memory device and a host or nonvolatile memory device controller in accordance with some embodiments.

FIG. 3 is a block diagram of a system 300 including a memory device 330 (e.g., a nonvolatile memory device) and a host or memory device controller 301 in accordance with some embodiments. The memory device 330 includes an array 332 of multi-level cells. While the controller 301 is shown as a separate device (e.g., a separate integrated circuit) from the memory device 330, in some embodiments all or a portion of the illustrated elements 302-320 of the controller 301 are implemented in the memory device 330 instead of in the controller 301. In some embodiments, the memory device 330 is a memory integrated circuit (i.e., a memory chip) such as a multi-level flash chip, phase change RAM, resistance RAM, or DRAM. In some embodiments, the memory device 330 is an integrated circuit with embedded multi-level memory. For example, the memory device 330 may be a microcontroller with an embedded multi-level memory array 332.

Data sets (e.g., pages) to be programmed into the memory array 332 are received at and queued in a write buffer 308 in the controller 301. Data sets queued in the buffer 308 are provided to cost evaluation circuitry 310, which evaluates costs associated with using various available multi-level encodings to program respective data sets into multi-level cells in the memory array 332. For example, the cost evaluation circuitry calculates costs for various encodings using Equation (8). Based on the evaluated costs, the cost evaluation circuitry 310 selects a multi-level encoding (e.g., the multi-level encoding having the lowest evaluated cost).

The cost evaluation circuitry 310 provides the selected encoding to an encoder 312, which uses the selected encoding to encode respective data sets (e.g., a pair of upper and lower pages) received from the write buffer 308 for storage in the memory array 332 of the memory device 330. The encoded data sets are stored in a buffer 314 and then provided to the memory device 330 for programming into the array 332. In some embodiments, the encoder appends an encode map of the selected multi-level encoding to the encoded data sets for storage in the memory array 332. The encode map is stored in register elements 318 in the buffer 314 and in memory elements 334 in the memory array 332. In some embodiments, the encode map is written to a separate memory from the array 332.

Optionally, the encoder also appends data representing the evaluated cost of the selected multi-level encoding to the encoded data sets for storage in the array 332. The data representing the evaluated cost is stored in register elements 320 in the buffer 314 and in memory elements 336 in the memory array 332.

Data read from the array 332 is queued in a buffer 306 and then provided to a decoder 304. The decoder 304 receives the encode map and decodes the data accordingly. In some embodiments, the encode map is received from the memory array 332. Alternatively, the encode map is received from a separate memory. The decoded data is queued in a read buffer 302 and then forwarded to elements in the system 300 that requested the data.

In some embodiments, two programming steps are performed to program respective multi-level cells in the array 332, as illustrated in FIG. 2 in accordance with some embodiments. The cost evaluation circuitry 310 selects a single-level encoding for the first programming step 200, and the encoder 312 encodes the lower page, which is provided to the memory device 330 for the first programming step 200. In some embodiments, the encoder 312 appends a single-level encode map to the lower page for storage in the array 332. To encode both the lower and upper page for the second programming step 202, the controller 301 reads back the lower page from the device 330. The decoder 304 decodes the lower page and provides it to the cost evaluation circuit 310. The cost evaluation circuit 310 also receives the upper page from the write buffer 308, and selects a multi-level encoding based on costs calculated using the data in the lower and upper pages.

In some embodiments, reading back the lower page is performed quickly, such that the read data contains errors and thus is only an approximation of the data in the lower page. The cost evaluation circuit 310 then uses this approximation of the lower page, along with the upper page as received from the write buffer 308, to calculate approximate programming costs and select a multi-level encoding. In some embodiments, instead of reading back the lower page, the single-level encode map for the lower page is read back from the memory device 330 and provided to the cost evaluation circuit 310. The cost evaluation circuit 310 then uses this encode map, along with the upper page as received from the write buffer 308, to select a multi-level encoding for use in the second programming step 202.

Figure 4A:
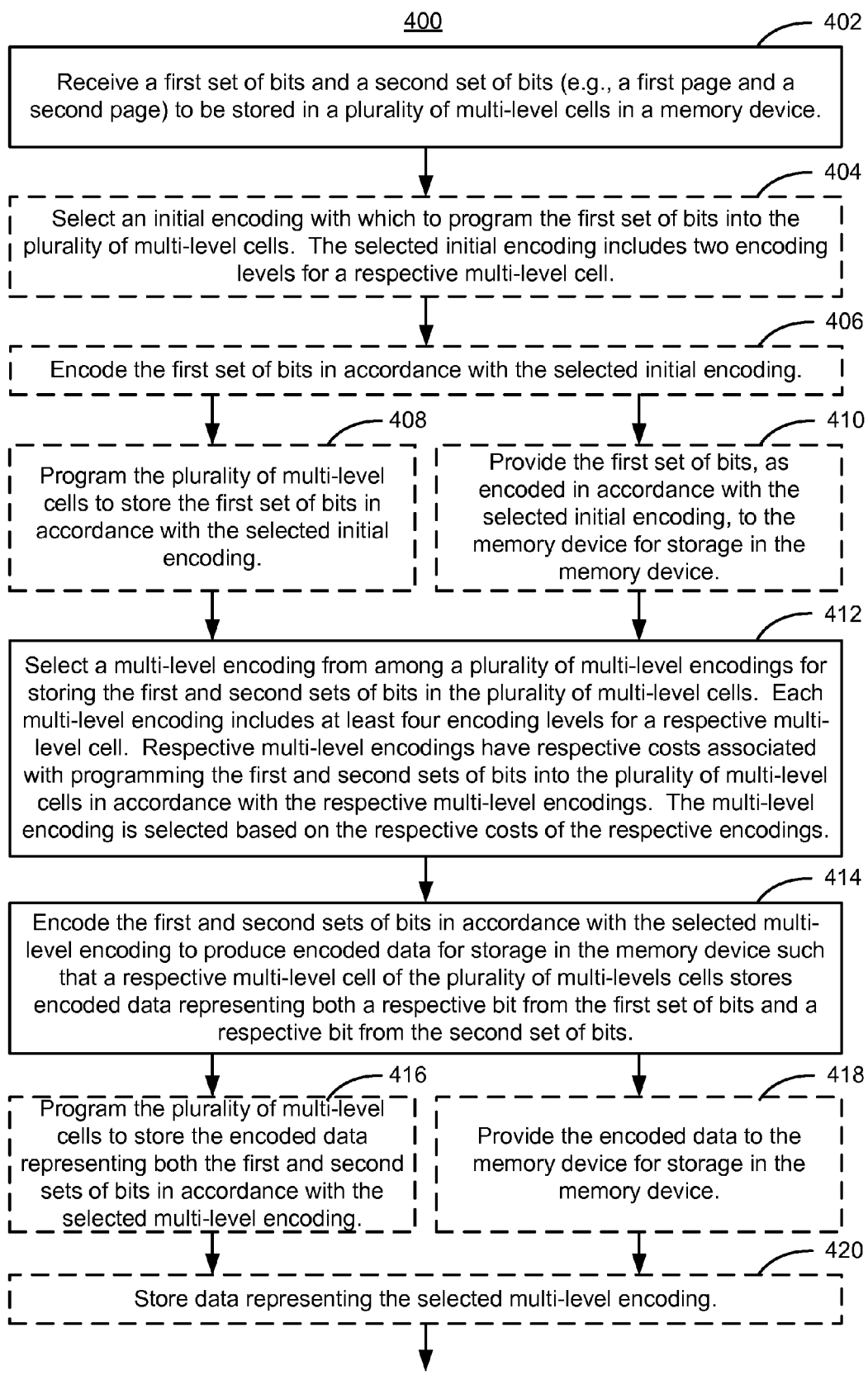
FIGS. 4A-4C are flow diagrams illustrating computer-implemented methods of operating a nonvolatile memory device in accordance with some embodiments.
Figure 4B:
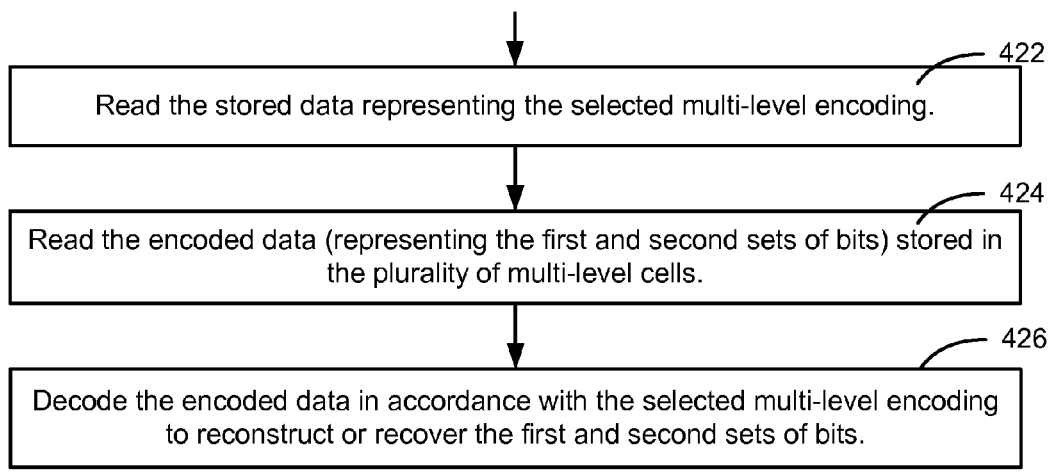

FIGS. 4A-4B are flow diagrams illustrating a computer-implemented method 400 of operating a memory device (e.g., a nonvolatile memory device) in accordance with some embodiments. In some embodiments, the method 400 is performed by a host or controller (e.g., controller 301, FIG. 3) coupled to a memory device. Alternatively, the method 400 may be performed by a memory device (e.g., the device 330, FIG. 3), or any device with embedded memory.

In the method 400, a first set of bits and a second set of bits to be stored in a plurality of multi-level cells (e.g., the memory array 332, FIG. 3) in a memory device are received (402, FIG. 4A). In some embodiments, the first set of bits is a first page (e.g., a lower page) and the second set of bits is a second page (e.g., an upper page). In some embodiments, the first and second sets of bits are distinct subsets of bits within a single page.

Optionally, an initial encoding with which to program the first set of bits into the plurality of multi-level cells is selected (404). The selected initial encoding (e.g., encoding 204, FIG. 2) includes two encoding levels for a respective multi-level cell. In some embodiments, the selected initial encoding minimizes a cost associated with programming the plurality of multi-level cells to store the first set of bits. The first set of bits is encoded (406) in accordance with the selected initial encoding. For example, the encoder 312 (FIG. 3) encodes the first set of bits in accordance with the selected initial encoding.

In some embodiments, the plurality of multi-level cells is programmed (408) to store the first set of bits in accordance with the selected initial encoding. In some embodiments, the first set of bits, as encoded in accordance with the selected initial encoding, is provided (410) to the memory device for storage in the memory device. For example, the controller 301 (FIG. 3) provides the encoded first set of bits to the memory device 330 (FIG. 3), and programming circuitry in the memory device 330 programs the encoded first set of bits into the memory array 332.

A multi-level encoding is selected (412) from among a plurality of multi-level encodings for storing the first and second sets of bits in the plurality of multi-level cells. Each multi-level encoding includes at least four encoding levels for a respective multi-level cell. Respective multi-level encodings have respective costs associated with programming the first and second sets of bits into the plurality of multi-level cells in accordance with the respective multi-level encodings. The multi-level encoding is selected based on the respective costs of the respective encodings. In some embodiments, the selected multi-level encoding has a lower cost compared to the respective costs of all other multi-level encodings of the plurality of multi-level encodings, or has a cost less than or equal to the respective costs of all other multi-level encodings of the plurality of multi-level encodings.

In some embodiments, selecting the multi-level encoding includes calculating respective costs for respective multi-level encodings of the plurality of multi-level encodings based on values of the bits in the first and second sets of bits (e.g., in accordance with Equation (8)). Alternately, selecting the multi-level encoding includes calculating respective costs for respective multi-level encodings of the plurality of multi-level encodings based on values of the bits in the second set of bits and an approximation of values of the bits in the first set of bits. For example, if the first set of bits was programmed in a first programming step (e.g., step 200, FIG. 2), approximate values of the bits in the first set may be determined by performing a fast read. These approximate values then may be used in Equation (8). If an initial coding has already been selected (404) for the first set of bits, selecting the multi-level encoding includes calculating respective costs for respective multi-level encodings of the plurality of multi-level encodings based on the selected initial encoding and on values of the bits in the second set of bits. For example, if the selected initial encoding indicates that the first set of bits has more zeros than ones, and if the second set of bits also has more zeros than ones, then a multi-level encoding is selected that maps "00" to the lowest level (e.g., level 134, FIG. 2) and maps other data words accordingly.

In some embodiments, the plurality of multi-level encodings from which a multi-level encoding is selected includes every multi-level encoding for storing the first and second sets of bits in the plurality of multi-level cells such that respective multi-level cells of the plurality of multi-level cells store respective bits from both the first and second sets of bits (e.g., all 24 encodings $M_0$ 120 through $M_{23}$ 124 (FIG. 1B) in the example of 2-bit multi-level cells). Alternatively, the plurality of multi-level encodings from which a multi-level encoding is selected includes a subset of all multi-level encodings for storing the first and second sets of bits in the plurality of multi-level cells such that respective multi-level cells of the plurality of multi-level cells store respective bits from both the first and second sets of bits (e.g., a subset of the 24 encodings $M_0$ 120 through $M_{23}$ 124 (FIG. 1B) in the example of 2-bit multi-level cells).

The first and second sets of bits are encoded (414) (e.g., by the encoder 312, FIG. 3) in accordance with the selected multi-level encoding to produce encoded data for storage in the memory device. After the encoded data is stored in the non-volatile memory device (416, 418), a respective multi-level cell of the plurality of multi-levels cells stores both a respective bit from the first set of bits and a respective bit from the second set of bits.

A plurality of multi-level cells (in the memory device) is programmed (416) to store both the encoded data (encoded first and second sets of bits) in accordance with the selected multi-level encoding. In some embodiments, the encoded data is provided (418) to the memory device for storage in the memory device. For example, the controller 301 (FIG. 3) provides the encoded first and second sets of bits to the memory device 330 (FIG. 3), and programming circuitry in the memory device 330 programs the encoded data (the encoded first and second sets of bits) into the memory array 332.

In some embodiments, each multi-level cell of the plurality of multi-level cells is programmable to a plurality of distinct voltage levels, and respective encoding levels of each multi-level encoding correspond to respective voltage levels of the plurality of distinct voltage levels. For example, the multi-level cells may be multi-level flash or SONOS cells. In some other embodiments, each multi-level cell of the plurality of multi-level cells is programmable to a plurality of distinct resistance levels and respective encoding levels of each multi-level encoding correspond to respective resistance levels of the plurality of distinct resistance levels. For example, the multi-level cells may be multi-level phase change or resistance RAM cells.

In some embodiments, each multi-level cell of the plurality of multi-level cells is programmable to four distinct levels. Optionally, for each multi-level encoding of the plurality of multi-level encodings, the highest two levels of respective multi-level cells of the plurality of multi-level cells correspond to a first bit value for the first set (or second set) of bits and the lowest two levels of respective multi-level cells of the plurality of multi-level cells correspond to a second bit value for the first set (or second set) of bits. The second bit value is the complement of the first bit value. For example, in the encodings 120, 122, 124, and 142 (FIG. 1D), the highest two levels 128 and 130 correspond to a first value of the MSB of the cell's 2-bit data word and the lowest two levels 132 and 134 correspond to a second value of the MSB of the cell's 2-bit data word.

Data (420) representing the selected multi-level encoding is stored, typically in the same non-volatile memory device as the encoded data. In some embodiments, the data representing the selected multi-level encoding are programmed into one or more multi-level cells of the plurality of multi-level cells. For example, encode maps are stored in memory elements 334 of the memory device 330 (FIG. 3). In some other embodiments, the data representing the selected multi-level encoding are stored in a memory distinct from the plurality of multi-level cells (e.g., in a buffer or look-up table in the controller 301, FIG. 3, or in a separate memory device distinct from the device 330 and controller 301).

To perform a read operation, the stored data representing the selected multi-level encoding are read (422, FIG. 4B) and the encoded data (representing the first and second sets of bits) stored in the plurality of multi-level cells are read (424). The encoded data is decoded (426) (e.g., by the decoder 304, FIG. 3) in accordance with the selected multi-level encoding so as to reconstruct or recover the first and second sets of bits.

The method 400 thus provides intelligent storage of data in multi-level memory. By selecting different encodings for different sets of data to be programmed as a function of the data to be programmed, programming time and damage associated with programming is reduced, program disturb is reduced, and overall reliability of the memory is improved.

While the method 400 includes a number of operations that appear to occur in a specific order, it should be apparent that the method 400 can include more or fewer operations, which can be executed serially or in parallel. For example, one or more of the operations 404-410 and 416-420 (displayed in dashed boxes) may be omitted in some embodiments. An order of two or more operations may be changed and two or more operations may be combined into a single operation. Furthermore, elements of a single operation may be performed at different times. For example, in operation 402 the first set of bits may be received prior to the second set of bits.

Figure 4C:
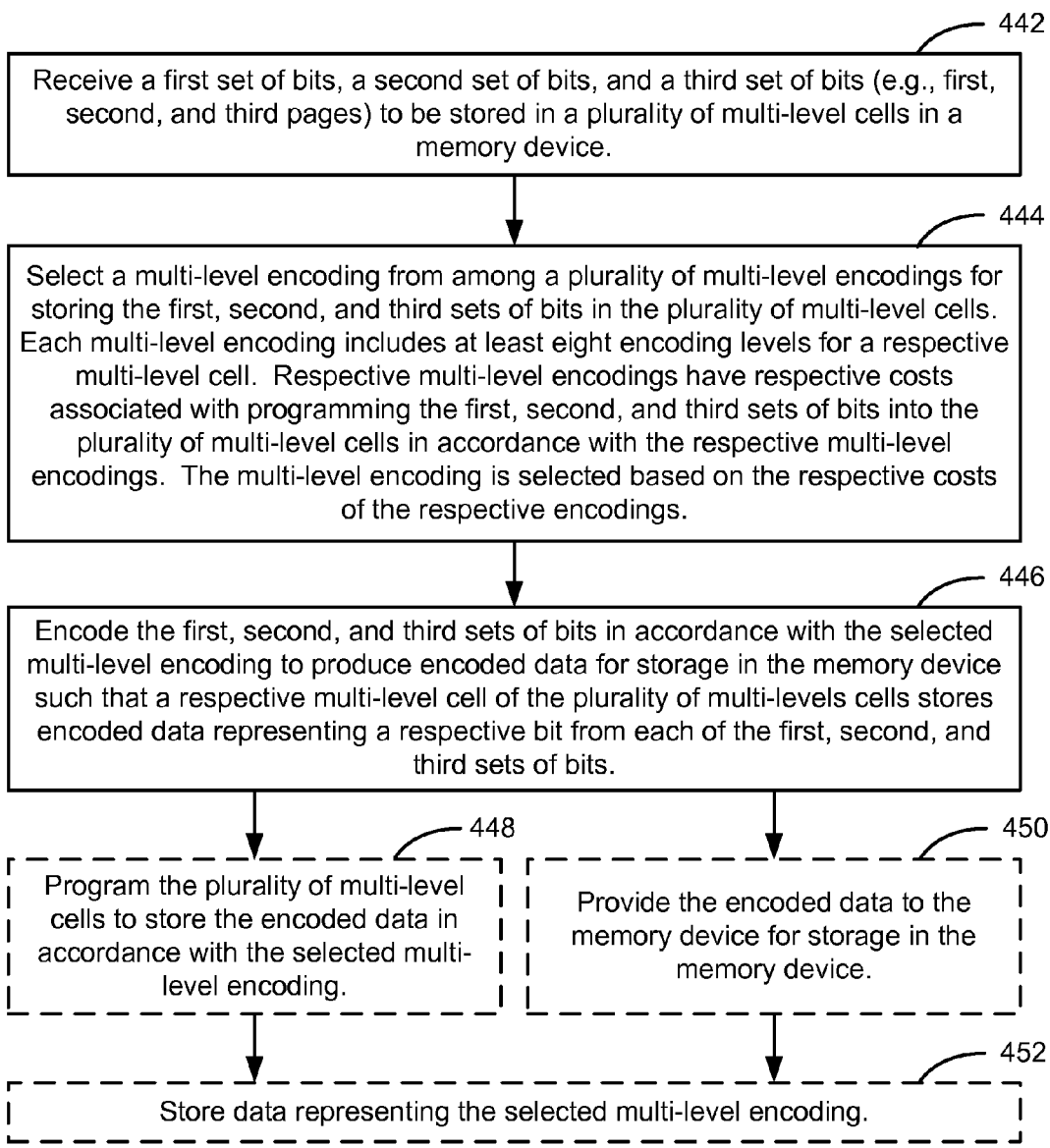

FIG. 4C is a flow diagram illustrating a computer-implemented method 440 of operating a memory device (e.g., a nonvolatile memory device) in accordance with some embodiments. In some embodiments, the method 440 is performed by a host or controller (e.g., controller 301, FIG. 3) coupled to a memory device. Alternatively, the method 440 may be performed by a memory device (e.g., the device 330, FIG. 3), or any device with embedded memory. The method 440 is an example of an implementation of the method 400 (FIGS. 4A-4B).

In the method 440, a first set of bits, a second set of bits, and a third set of bits (e.g., first, second, and third pages, or alternatively, three distinct subsets of bits in a single page) to be stored in a plurality of multi-level cells in a memory device are received (442) (e.g., at the write buffer 308, FIG. 3).

A multi-level encoding is selected (444) (e.g., by cost evaluation circuitry 310, FIG. 3) from among a plurality of multi-level encodings for storing the first, second, and third sets of bits in the plurality of multi-level cells. Each multi-level encoding includes at least eight encoding levels for a respective multi-level cell. Respective multi-level encodings have respective costs associated with programming the first, second, and third sets of bits into the plurality of multi-level cells in accordance with the respective multi-level encodings. The multi-level encoding is selected based on the respective costs of the respective encodings.

The first, second, and third sets of bits are encoded (446) (e.g., by the encoder 312, FIG. 3) in accordance with the selected multi-level encoding to produce encoded data for storage in the memory device such that a respective multi-level cell of the plurality of multi-levels cells stores encoded data representing a respective bit from each of the first, second, and third sets of bits.

The plurality of multi-level cells is programmed (448) to store the encoded data (representing the first, second, and third sets of bits) in accordance with the selected multi-level encoding. In some embodiments, the encoded data is provided (450) to the memory device for storage in the memory device.

In some embodiments, data representing the selected multi-level encoding is stored (452). To perform a read operation, the stored data representing the selected multi-level encoding is read and the encode data stored in the plurality of multi-level cells are read. The encoded data is decoded (e.g., by the decoder 304, FIG. 3) in accordance with the selected multi-level encoding to produce the first, second, and third sets of bits.

The method 440 thus provides intelligent storage that reduces programming time and improves the reliability of multi-level memory. While the method 440 includes a number of operations that appear to occur in a specific order, it should be apparent that the method 440 can include more or fewer operations, which can be executed serially or in parallel. For example, one or more of the operations 448-452 (displayed in dashed boxes) may be omitted in some embodiments. An order of two or more operations may be changed and two or more operations may be combined into a single operation. Furthermore, elements of a single operation may be performed at different times. For example, in operation 442, the first, second, and third sets of bits may be received at different times.

Figure 5:
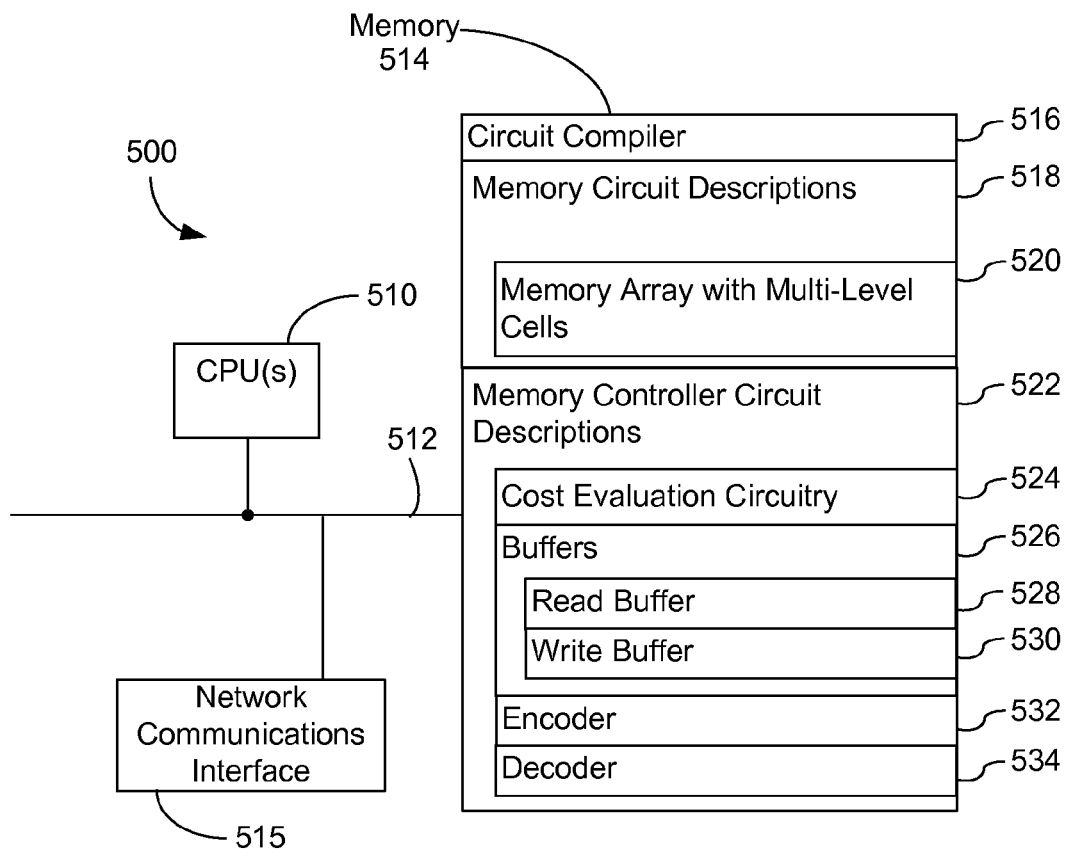
FIG. 5 is a block diagram of an embodiment of a system for storing computer readable files containing software descriptions of circuits for implementing a system including multi-level nonvolatile memory and nonvolatile memory controller circuitry in accordance with some embodiments.

FIG. 5 is a block diagram of an embodiment of a system 500 for storing computer readable files containing software descriptions of circuits for implementing memories and memory controllers in accordance with some embodiments. The system 500 may include one or more data processors or central processing units (CPUs) 510, memory 514, (optionally) one or more communication interfaces 515 for exchanging information with other computer systems or devices, and one or more signal lines or communication busses 512 for coupling these components to one another. The communication buses 512 may include circuitry (sometimes called a chipset) that interconnects and controls communications between system components. Memory 514 includes high-speed random access memory, such as DRAM, SRAM, DDR RAM or other random access solid state memory devices; and may include nonvolatile memory, such as one or more magnetic disk storage devices, optical disk storage devices, flash memory devices, or other nonvolatile solid state storage devices. Memory 514 may optionally include one or more storage devices remotely located from the CPU(s) 510. Memory 514, or alternately one or more of the nonvolatile memory device(s) within memory 514, comprises a computer readable storage medium. In some embodiments, the computer readable storage medium stores a circuit compiler 516, memory circuit descriptions 518, and memory controller circuit descriptions 522. The circuit compiler 516, when executed by a processor such as CPU(s) 510, processes one or more circuit descriptions to synthesize one or more corresponding circuits.

In some embodiments, the memory circuit descriptions 518 include circuit descriptions for a memory array 520 with multi-level cells. In some embodiments, the memory controller circuit descriptions 522 include circuit descriptions for cost evaluation circuitry 524, buffers 526, an encoder 532, and a decoder 534. In some embodiments, the circuit description for the buffers 526 includes circuit descriptions for a read buffer 528 and a write buffer 530.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method of operating a memory device, comprising:
   receiving a first set of bits and a second set of bits to be stored in a plurality of multi-level cells in the memory device;
   selecting a multi-level encoding from among a plurality of multi-level encodings for storing the first and second sets of bits in the plurality of multi-level cells, each multi-level encoding of the plurality of multi-level encodings including at least four encoding levels for a respective multi-level cell, respective multi-level encodings of the plurality of multi-level encodings having respective costs associated with programming the first and second sets of bits into the plurality of multi-level cells in accordance with the respective multi-level encodings, wherein the selecting is based on the respective costs of the respective encodings; and
   encoding the first and second sets of bits in accordance with the selected multi-level encoding to produce encoded data for storage in the memory device such that a respective multi-level cell of the plurality of multi-levels cells stores encoded data representing both a respective bit from the first set of bits and a respective bit from the second set of bits, wherein the method further comprises, prior to encoding the first and second sets of bits in accordance with the selected multi-level encoding:
      selecting an initial encoding with which to program the first set of bits into the plurality of multi-level cells, the selected initial encoding including two encoding levels for a respective multi-level cell; and
      encoding the first set of bits in accordance with the selected initial encoding.

2. The method of claim 1, further comprising, prior to encoding the first and second sets of bits in accordance with the selected multi-level encoding:
   programming the plurality of multi-level cells to store the first set of bits in accordance with the selected initial encoding.

3. The method of claim 1, further comprising, prior to encoding the first and second sets of bits in accordance with the selected multi-level encoding:
   providing the first set of bits, as encoded in accordance with the selected initial encoding, to the memory device for storage in the memory device.

4. The method of claim 1, wherein the selected initial encoding minimizes a cost associated with programming the plurality of multi-level cells to store the first set of bits.

5. The method of claim 1, wherein selecting the multi-level encoding comprises calculating respective costs for respective multi-level encodings of the plurality of multi-level encodings based on values of the bits in the second set of bits and an approximation of values of the bits in the first set of bits.

6. The method of claim 1, wherein selecting the multi-level encoding comprises calculating respective costs for respective multi-level encodings of the plurality of multi-level encodings based on the selected initial encoding and on values of the bits in the second set of bits.

7. The method of claim 1, wherein selecting the multi-level encoding comprises calculating respective costs for respective multi-level encodings of the plurality of multi-level encodings based on values of the bits in the first and second sets of bits.

8. The method of claim 1, wherein the selected multi-level encoding has a lower cost compared to the respective costs of all other multi-level encodings of the plurality of multi-level encodings.

9. The method of claim 1, wherein the selected multi-level encoding has a cost less than or equal to the respective costs of all other multi-level encodings of the plurality of multi-level encodings.

10. The method of claim 1, wherein the first set of bits comprises a first page and the second set of bits comprises a second page.

11. The method of claim 1, wherein:
   each multi-level cell of the plurality of multi-level cells is programmable to a plurality of distinct voltage levels; and
   respective encoding levels of each multi-level encoding correspond to respective voltage levels of the plurality of distinct voltage levels.

12. The method of claim 1, wherein:
each multi-level cell of the plurality of multi-level cells is programmable to a plurality of distinct resistance levels; and
respective encoding levels of each multi-level encoding correspond to respective resistance levels of the plurality of distinct resistance levels.

13. The method of claim 1, wherein:
each multi-level cell of the plurality of multi-level cells is programmable to four distinct levels; and
for each multi-level encoding of the plurality of multi-level encodings, the highest two levels of respective multi-level cells of the plurality of multi-level cells correspond to a first bit value for the first set of bits and the lowest two levels of respective multi-level cells of the plurality of multi-level cells correspond to a second bit value for the first set of bits, the second bit value being the complement of the first bit value.

14. The method of claim 1, further comprising:
storing data representing the selected multi-level encoding.

15. The method of claim 14, wherein the data representing the selected multi-level encoding are programmed into one or more multi-level cells of the plurality of multi-level cells.

16. The method of claim 14, wherein the data representing the selected multi-level encoding are stored in a memory distinct from the plurality of multi-level cells.

17. The method of claim 14, further comprising:
reading the stored data representing the selected multi-level encoding;
reading the encoded data stored in the plurality of multi-level cells; and
decoding the encoded data in accordance with the selected multi-level encoding to produce the first and second sets of bits represented by the encoded data.

18. The method of claim 1, wherein:
the plurality of multi-level encodings enable a third set of bits to be stored in the plurality of multi-level cells along with the first and second sets of bits, each multi-level encoding of the plurality of multi-level encodings including at least eight encoding levels for a respective multi-level cell, the respective costs including costs associated with programming the third set of bits along with the first and second sets of bits into the plurality of multi-level cells in accordance with the respective multi-level encodings,
the method further comprising:
receiving the third set of bits; and
encoding the third set of bits in accordance with the selected multi-level encoding to produce encoded data for storage in the memory device such that a respective multi-level cell of the plurality of multi-levels cells stores encoded data representing a respective bit from each of the first, second, and third sets of bits.

19. A method of operating a memory device, comprising:
identifying a first encoding with which a first set of bits has been programmed into a plurality of multi-level cells;
receiving a second set of bits to be stored in the plurality of multi-level cells in the memory device;
selecting a multi-level encoding from among a plurality of multi-level encodings for storing the first and second sets of bits in the plurality of multi-level cells, each multi-level encoding of the plurality of multi-level encodings including at least four encoding levels for a respective multi-level cell, respective multi-level encodings of the plurality of multi-level encodings having respective costs associated with programming the first and second sets of bits into the plurality of multi-level cells in accordance with the respective multi-level encodings, wherein the selecting is based on the respective costs of the respective encodings; and
encoding the first and second sets of bits in accordance with the selected multi-level encoding to produce encoded data for storage in the memory device such that a respective multi-level cell of the plurality of multi-levels cells stores encoded data representing both a respective bit from the first set of bits and a respective bit from the second set of bits.

20. Circuitry to control memory, comprising:
a buffer to queue data to be stored in a plurality of multi-level cells in a memory device, the data comprising a first set of bits and a second set of bits;
cost-evaluation circuitry to evaluate costs associated with programming the first and second sets of bits into the plurality of multi-level cells in accordance with respective multi-level encodings of a plurality of multi-level encodings and to select, based on the evaluated costs, a respective multi-level encoding of the plurality of multi-level encodings with which to program the first and second sets of bits into the plurality of multi-level cells, wherein each multi-level encoding of the plurality of multi-level encodings includes at least four encoding levels for a respective multi-level cell; and
an encoder to encode the first and second sets of bits, in accordance with the selected multi-level encoding, for storage in the plurality of multi-level cells such that a respective multi-level cell of the plurality multi-levels cells stores encoded data representing both a respective bit from the first set of bits and a respective bit from the second set of bits, wherein:
the cost evaluation circuitry is configured to select, prior to selection of the respective multi-level encoding, an initial encoding with which to program the first set of bits into the plurality of multi-level cells, the initial encoding including two encoding levels for a respective multi-level cell; and
the encoder is configured to encode the first set of bits in accordance with the selected initial encoding, for programming into the plurality of multi-level cells, prior to encoding the first and second sets of bits in accordance with the respective multi-level encoding.

21. The circuitry of claim 20, wherein the selected initial encoding minimizes a cost associated with programming the plurality of multi-level cells to store the first set of bits.

22. The circuitry of claim 20, wherein the cost evaluation circuitry is configured to evaluate costs based on the selected initial encoding and on values of the bits in the second set of bits.

23. The circuitry of claim 20, wherein the cost evaluation circuitry is configured to evaluate costs based on values of the bits in the first and second sets of bits.

24. The circuitry of claim 20, wherein the cost evaluation circuitry is configured to evaluate costs based on values of the bits in the second set of bits and an approximation of values of the bits in the first set of bits.

25. The circuitry of claim 20, wherein the selected multi-level encoding has a lower cost compared to the respective costs of all other multi-level encodings of the plurality of multi-level encodings.

26. The circuitry of claim 20, wherein the selected multi-level encoding has a cost less than or equal to the respective costs of all other multi-level encodings of the plurality of multi-level encodings.

27. The circuitry of claim 20, wherein:
  each multi-level cell of the plurality of multi-level cells is programmable to a plurality of distinct voltage levels; and
  respective encoding levels of each multi-level encoding correspond to respective voltage levels of the plurality of distinct voltage levels.

28. The circuitry of claim 20, wherein:
  each multi-level cell of the plurality of multi-level cells is programmable to a plurality of distinct resistance levels; and
  respective encoding levels of each multi-level encoding correspond to respective resistance levels of the plurality of distinct resistance levels.

29. The circuitry of claim 20, wherein:
  each multi-level cell of the plurality of multi-level cells is programmable to four distinct levels; and
  the encoder is configured to associate the highest two levels of respective multi-level cells of the plurality of multi-level cells with a first bit value for the first set of bits and to associate the lowest two levels of respective multi-level cells of the plurality of multi-level cells with a second bit value for the first set of bits, the second bit value being the complement of the first bit value.

30. The circuitry of claim 20, wherein:
  the buffer is configured to store a third set of bits to be stored in the plurality of multi-level cells;
  the cost evaluation circuitry is configured to evaluate costs associated with programming the third set of bits into the plurality of multi-level cells along with the first and second sets of bits in accordance with the respective multi-level encodings, each multi-level encoding of the plurality of multi-level encodings including at least eight encoding levels for a respective multi-level cell; and
  the encoder is configured to encode the third set of bits, in accordance with the selected multi-level encoding, for storage in the memory device such that a respective multi-level cell of the plurality of multi-levels cells stores encoded data representing a respective bit from each of the first, second, and third sets of bits.

31. The method of claim 19, further comprising, prior to encoding the first and second sets of bits in accordance with the selected multi-level encoding:
  selecting the first encoding with which to program the first set of bits into the plurality of multi-level cells, the first encoding including two encoding levels for a respective multi-level cell; and
  encoding the first set of bits in accordance with the first encoding.

32. The method of claim 19, wherein the first encoding minimizes a cost associated with programming the plurality of multi-level cells to store the first set of bits.

33. The method of claim 19, wherein selecting the multi-level encoding comprises calculating the respective costs for the respective multi-level encodings of the plurality of multi-level encodings based on values of the bits in the second set of bits and an approximation of values of the bits in the first set of bits.

34. The method of claim 19, wherein selecting the multi-level encoding comprises calculating respective costs for respective multi-level encodings of the plurality of multi-level encodings based on the first encoding and on values of the bits in the second set of bits.

* * * * *